(12) United States Patent
Bergemont et al.

(10) Patent No.: US 6,184,099 B1
(45) Date of Patent: *Feb. 6, 2001

(54) LOW COST DEEP SUB-MICRON CMOS PROCESS

(75) Inventors: Albert M. Bergemont, Palo Alto; Christopher I. Michael, Fremont, both of CA (US)

(73) Assignee: National Semiconductor Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/136,893

(22) Filed: Aug. 19, 1998

(51) Int. Cl.[7] ................................................. H01L 21/336
(52) U.S. Cl. ........................ 438/305; 438/231; 438/232; 438/514
(58) Field of Search ................................... 438/919, 231, 438/232, 228, 199, 301, 302, 305, 210, 514, 527, 532

(56) References Cited

U.S. PATENT DOCUMENTS

| | | | |
|---|---|---|---|
| 4,968,639 | * | 11/1990 | Bergonzoni ........................ 438/231 |
| 5,272,367 | * | 12/1993 | Dennison et al. ................... 257/306 |
| 5,405,791 | * | 4/1995 | Ahmad et al. ...................... 438/228 |
| 5,486,480 | * | 1/1996 | Chen .................................. 438/257 |
| 5,534,449 | * | 7/1996 | Dennison et al. ................... 438/231 |
| 5,654,213 | * | 8/1997 | Choi et al. ......................... 438/227 |
| 5,750,424 | * | 5/1998 | Choi et al. ......................... 438/199 |

OTHER PUBLICATIONS

Stanley Wolf Ph.D., "Silicon Processing for the VLSI ERA vol. 2: Process Integration", Lattice Press, Sunset Beach, California, pp. 436–437.

* cited by examiner

Primary Examiner—Savitri Mulpupi
Assistant Examiner—Christopher Latin
(74) Attorney, Agent, or Firm—Skjerven Morrill MacPherson LLP

(57) ABSTRACT

A low cost method of producing proper source/drain junctions and transistor characteristics is disclosed. Through consolidation of masking steps, source/drain processing has a significantly lower cost with no performance loss. A blanket boron implant is employed as both a PLDD implant for the PMOS and a halo region implant for the NMOS. After formation of sidewall spacers on the gates, a masked arsenic and phosphorous implant is employed as a N+ implant. Because the phosphorous drives in faster than the arsenic, the desired N+/NLDD/halo architecture is generated. A masked boron implant is then employed as the P+ implant. Thus, the source/drain junctions are formed using only two masked implants. In an alternative embodiment, a third masked implant of phosphorous is used to form the NLDD junction prior to the sidewall spacer deposition instead of phosphorous being implanted with the arsenic.

17 Claims, 5 Drawing Sheets

LOW COST DEEP SUB-MICRON CMOS PROCESS

FIELD OF INVENTION

The present invention relates to a method of fabricating semiconductor integrated circuits, and more specifically to a method of forming proper source/drain junctions and transistor characteristics in a deep sub-micron complementary MOS (CMOS).

BACKGROUND

Current deep sub-micron CMOS processes use four photolithography steps to form proper source/drain (S/D) junctions having lightly doped drain (LDD) junctions, and to produce desired transistor characteristics.

FIG. 1 shows a cross-sectional view of a semiconductor substrate 10 in an intermediate stage of a standard deep sub-micron CMOS process. Substrate 10 is shown with isolation regions 15, a gate oxide layer 20 on the surface of substrate 10, and polysilicon gates 25. A photoresist layer 30 is patterned over a N– well 35 and a masked N– implant is ther performed, creating self-aligned NLDD junctions 40. A P– implant is also performed creating halo regions 45. Photoresist layer 30 is then removed and a thermal cycle drives in the N– implant and the P– implant. A second photoresist layer 50 is then patterned over substrate 10, as shown in FIG. 2. A masked P– implant is performed creating self-aligned PLDD junctions 55.

FIG. 3 shows spacer sidewalls 60 formed on polysilicon gates 25 after gate oxide 20 has been removed. A third photoresist layer 65 is patterned over N– well region 35. A masked arsenic N+ implant is performed forming source/drain junctions 70. Photoresist layer 65 is removed and an annealing thermal cycle is used to drive in the N+ implant.

FIG. 4 shows a fourth photoresist layer 75 patterned into a mask. A masked P+ implant is then performed forming source/drain junctions 80. Photoresist layer 75 is then removed and an annealing thermal cycle drives in the P+ implant.

Thus, as illustrated in FIGS. 1–4, there are four photolithography steps to produce source/drain junctions with LDDs in standard CMOS processing. Each photolithography step, however, is costly and time consuming because of the materials used and the reduction in throughput. Therefore, a method to limit the amount of required photolithography steps is desirable.

SUMMARY

In accordance with the present invention, a low cost method for producing proper source/drain junctions and transistor characteristics for a sub-micron CMOS device uses a minimum of masking steps. Through the consolidation of masking steps, source/drain processing has a significantly lower cost with no performance loss. A blanket P– implant of boron is employed to simultaneously form PLDD junctions for the PMOS and halo regions for the NMOS. After sidewall spacers are formed adjacent to the walls of the gates, a masked arsenic and phosphorous implant is employed as a N+ implant, which is aligned with the sidewall spacers. The arsenic and phosphorous implant overcompensates for the previous boron implant. The NLDD junctions are created during the N+ anneal thermal cycle because the phosphorous drives in under the sidewall spacers faster than the arsenic. The P– halo structure is defined at this time. A masked boron implant is then employed to form the P+ source/drain junctions in the PMOS region.

In an alternative embodiment, phosphorous is not implanted simultaneously with the arsenic, but implanted to form the NLDD junction prior to the sidewall spacer deposition. This alternative embodiment requires the use of a masked implant of the phosphorous.

Thus, two masked implants are used in accordance with one embodiment the present invention to produce the desired source/drain junctions, while three masked implants are used in an alternative embodiment. Consequently, source/drain processing in accordance with the present invention has a significantly lower cost and no performance loss compared to the conventional method, which uses four masks.

BRIEF DESCRIPTION OF THE DRAWINGS

The present invention may be better understood and its numerous objects, features and advantages made apparent to those skilled in the art by referring to the accompanying drawings in which like components are referenced by like characters.

FIGS. 4–13 are simplified cross-sectional views of a semiconductor substrate in various stages in the fabrication of a CMOS device in accordance with the present invention.

DETAILED DESCRIPTION

Figure 1:
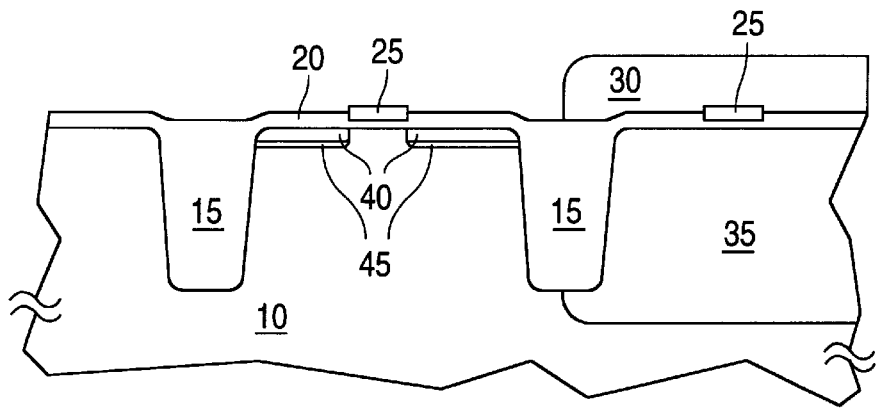
FIGS. 1–4 are simplified cross-sectional views of a semiconductor substrate in various stages in the fabrication of a CMOS device in accordance with the prior art.
Figure 2:
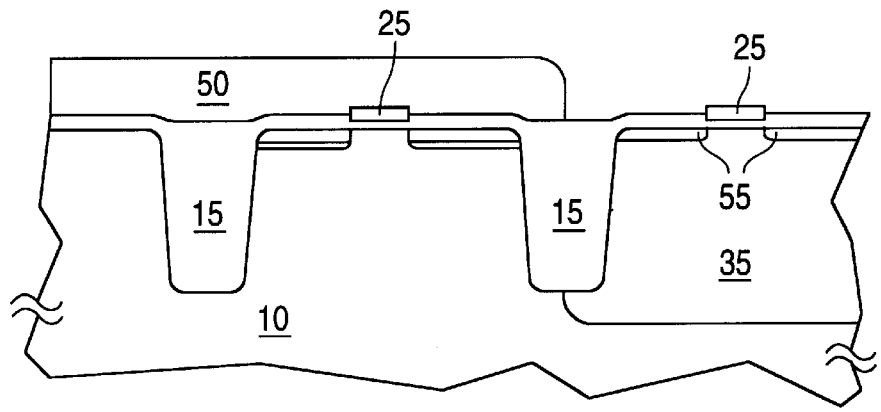
Figure 3:
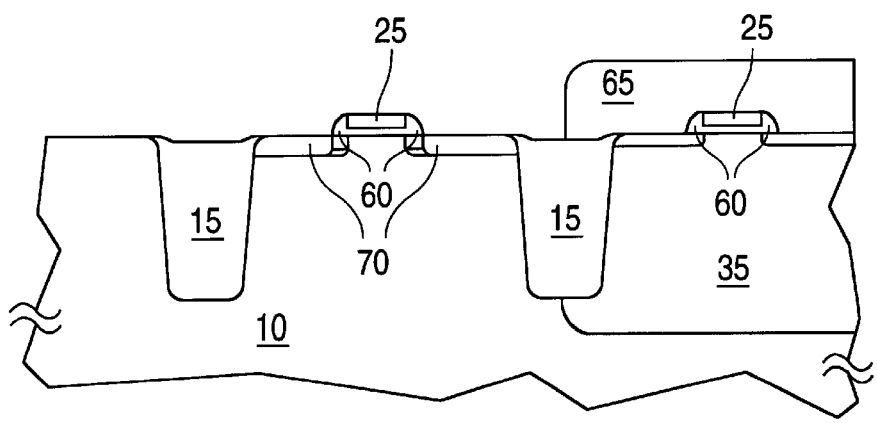
Figure 4:
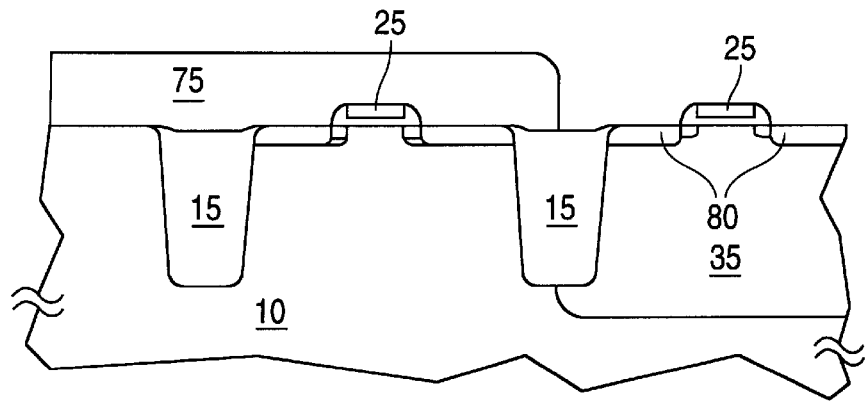
Figure 5:
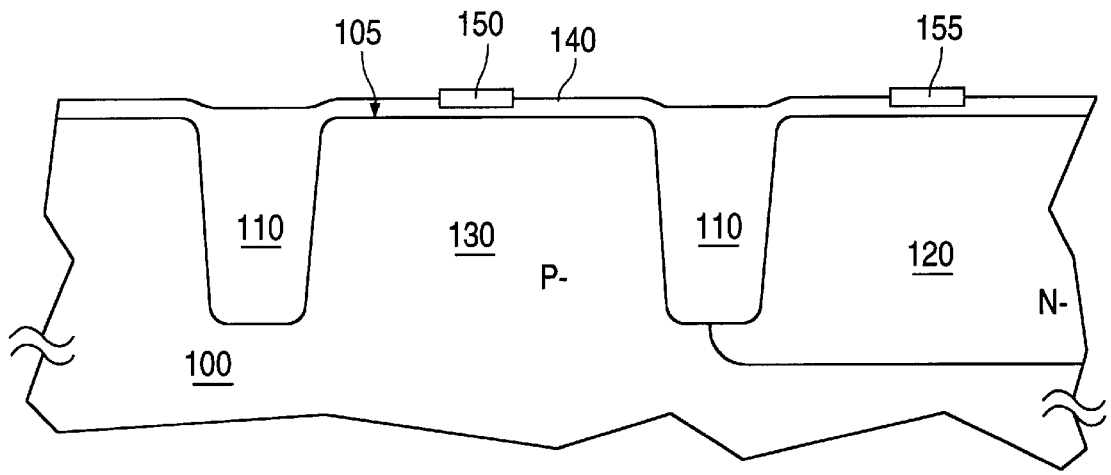

FIG. 5 is a simplified cross-sectional view of a semiconductor substrate in an intermediate stage in the fabrication of a Complementary Metal Oxide Silicon (CMOS) device in accordance with the present invention. A semiconductor substrate 100 is shown having shallow trench isolation regions 110. Semiconductor substrate 100 is a P-type silicon substrate with a N– well forming a PMOS region 120. It is understood, however, that other type of substrates may be employed, for instance, an N-type substrate may be used with a P-type well in a NMOS region 130, or an N or P-type substrate with N and P-type well regions and/or an epitaxial layer (not shown). The formation of N-type well in PMOS region 120 and P-type well (if used) in NMOS region 130 are accomplished in a conventional manner. While isolation regions 110 are shown as shallow trench isolation regions 110, it is understood that other methods of isolation can also be employed, such as Local Oxidation of Silicon (LOCOS) or selective epitaxial growth.

FIG. 5 shows a dielectric layer 140 formed on the upper surface 105 of substrate 100. Dielectric layer 140 may be a silicon oxide layer that is thermally grown in a conventional manner, such as in either dry ($O_2$) ambient, wet ($H_2O$) ambient, or a combination of both. Polysilicon gates 150, 155 are formed overlying dielectric layer 140. It is understood that gates 150, 155 can also be formed out of amorphous silicon or a combination of amorphous silicon and polysilicon. Polysilicon gates 150, 155 are formed in a conventional manner, such as depositing a layer of polysilicon by CVD and patterning the gate structures through standard photolithography and etching techniques. Polysilicon gates 150, 155 remain undoped at this stage.

Figure 6:
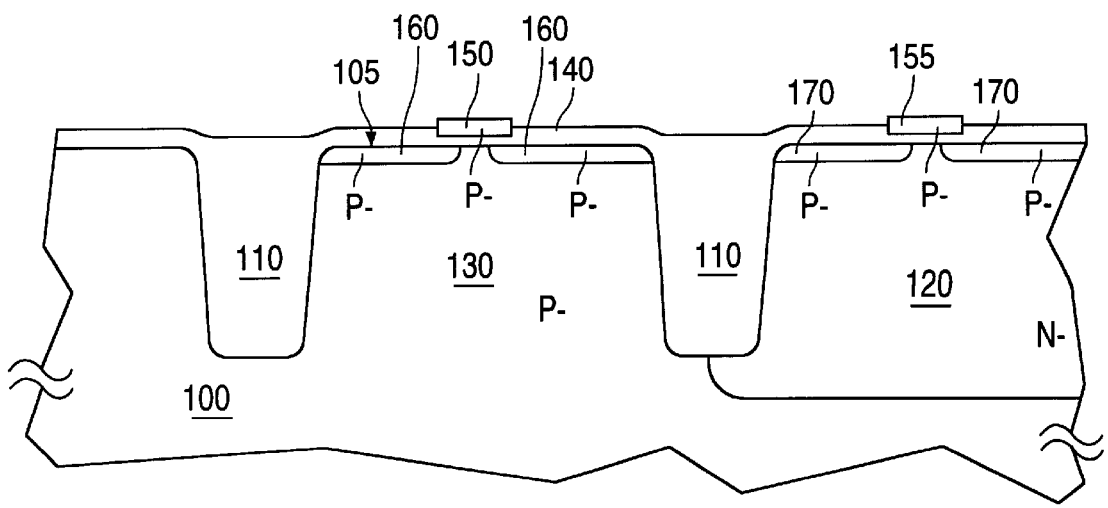

As shown in FIG. 6, P– lightly doped drain (PLDD) 170 junctions are formed within PMOS region 120. Simultaneously, P– doped regions 160, which will act as a halo structure, are formed within NMOS region 130. The PLDD junctions 170 and P– doped regions 160 are produced simultaneously in a blanket (unmasked) PLDD implant of boron ($BF_2$) at a dosage of approximately $5\times10^{13}$ cm$^{-2}$ at an energy of approximately 25 KeV, while substrate 100 is tilted at 7°. A more aggressive tilt (approximately 30°) with a higher energy (50–100 KeV) may be used to reduce channeling effects. The PLDD is implanted multiple times, for instance two or four times, while substrate 100 is rotated between each implantation.

The boron is implanted through dielectric layer 140, which protects the implant regions 160 and 170 from contamination during the procedure. Because a blanket implant of boron is used, there is no need for a masked PLDD implant The polysilicon gates 150, 155 are lightly doped during the blanket boron implant.

The concentration of boron in PLDD junctions 170 is an important factor in determining the drive current of the device. Thus, by adjusting the implant energy and dosage of the boron implant, the drive current of the device may be controlled. Moreover, the implantation angle may be adjusted to tune the device to the target performance.

Figure 7:
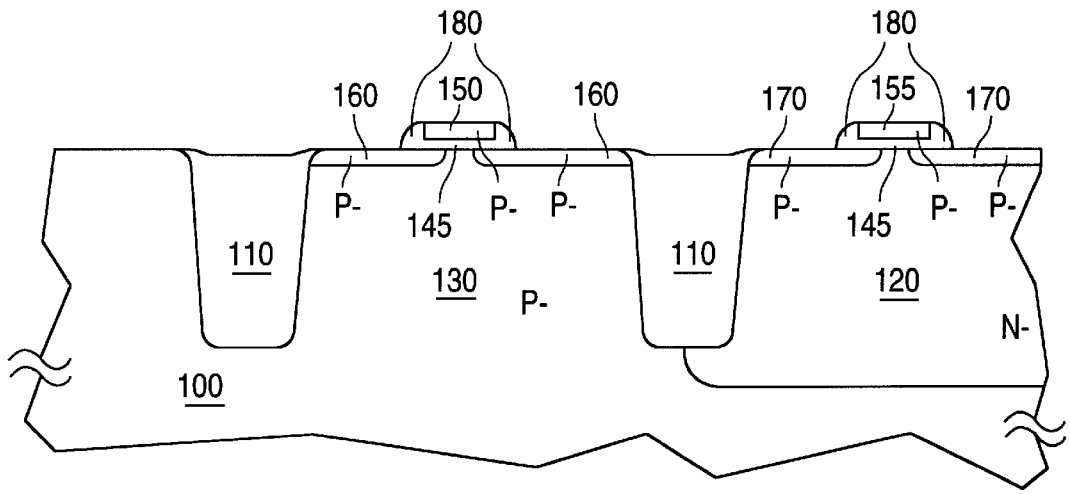

FIG. 7 shows sidewall spacers 180 formed on polysilicon gates 150, 155. Sidewall spacers 180 are formed in the conventional manner of depositing a blanket layer of a dielectric material, such as silicon nitride, and anisotropically etching the layer leaving sidewall spacers 180. Other dielectric materials, such as silicon oxide and/or a combination of Oxide and nitride, may alternatively be used. As shown in FIG. 7, dielectric layer 140 is stripped off substrate 100 but remains beneath polysilicon gates 150, 155 as gate dielectric layers 145. Dielectric layer 140 is etched away while forming sidewall spacers 180. Contamination that occurred during the boron implant is removed by etching off dielectric layer 140. Dielectric layer 140 may only be partially etched away during this step, with the remaining dielectric layer 140 serving as protection during the N+ and P+ implants. The remaining dielectric layer 140 is etched off after the N+ and P+ implants, discussed below.

Figure 8:
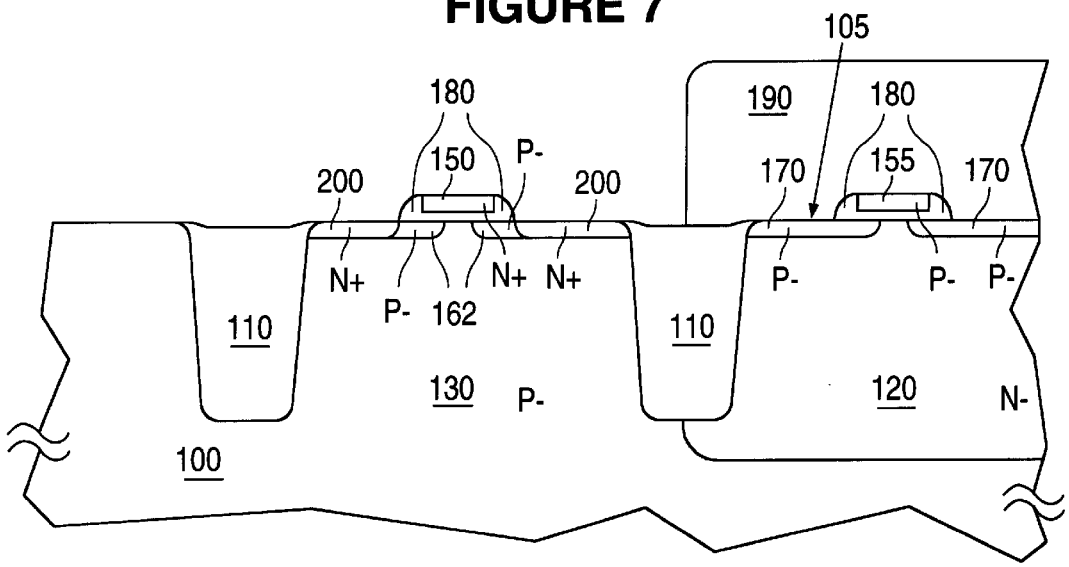

As shown in FIG. 8, a layer of photoresist 190 is applied to surface 105 of substrate 100 and patterned in a well-known manner to form a mask over PMOS region 120. A N+ type dopant is then implanted creating source and drain (S/D) junctions 200, which are aligned with sidewall spacers 180. Polysilicon gate 150 is N+ doped during this process.

In one embodiment of the present invention, the N+ type dopant is arsenic in combination with phosphorous. In this embodiment, the arsenic has an implant energy of approximately 50 KeV and a dosage of $5\times10^{15}$ cm$^{-2}$, while the implant energy of phosphorous is approximately 20 KeV at a dosage of $1\times10^{14}$ cm$^{-2}$. The concentration of phosphorous is an important factor in determining the drive current of the device. Thus, the drive current of the device may be controlled by adjusting the implant energy and dosage of the phosphorous. The N+ implant of combined arsenic and phosphorous in S/D junctions 200 overcompensates for the boron implant into P− doped regions 160, thus leaving reduced P− doped regions 162. Moreover, the N+ implant also overcompensates for the blanket boron implant in polysilicon gate 150.

Figure 9:
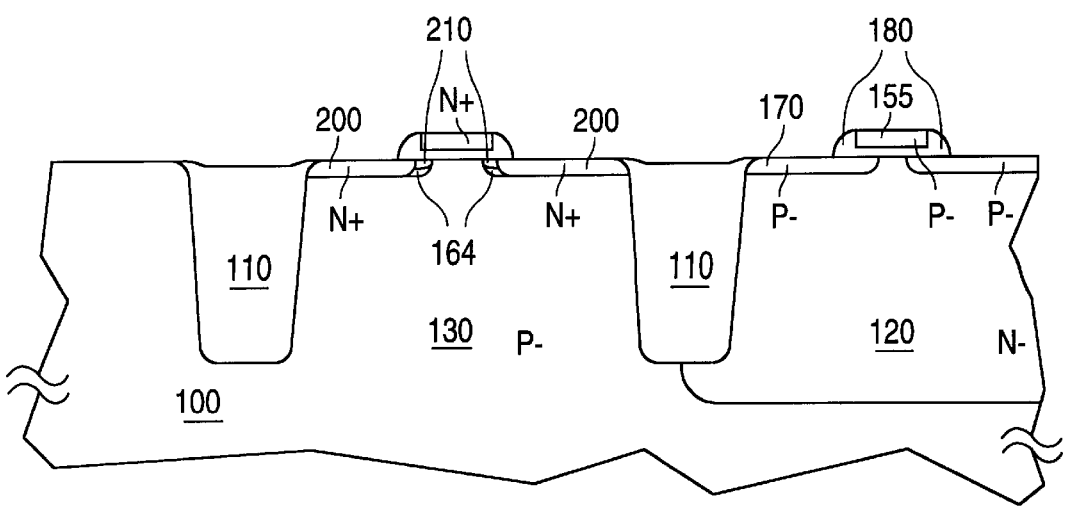
Figure 10:
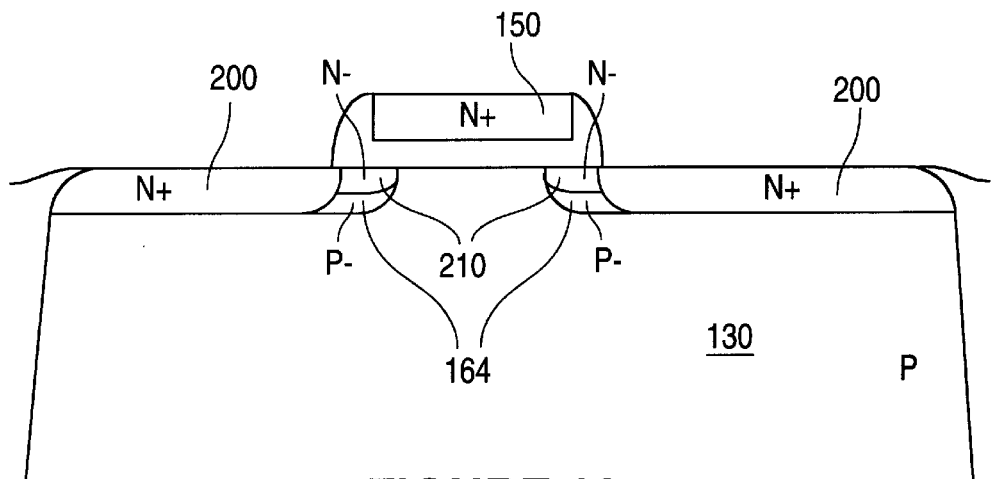

Photoresist 190 is removed and an anneal thermal cycle is used to drive the N+ implant under gate 150, as shown in FIG. 9. The thermal cycle is in a nitrogen environment for approximately 30 minutes at approximately 900° Celsius (C.). In the embodiment where the N+ type dopant is arsenic combined with phosphorous, the thermal cycle will drive in the phosphorous faster than the arsenic. A NLDD junction 210 is thus created within reduced P− region 162, and halo regions 164 are thereby defined. Thus, the desired N+/NLDD/halo architecture is created without the need for a NLDD mask. FIG. 10 shows a closer view of the N+/NLDD/halo architecture.

Figure 13:
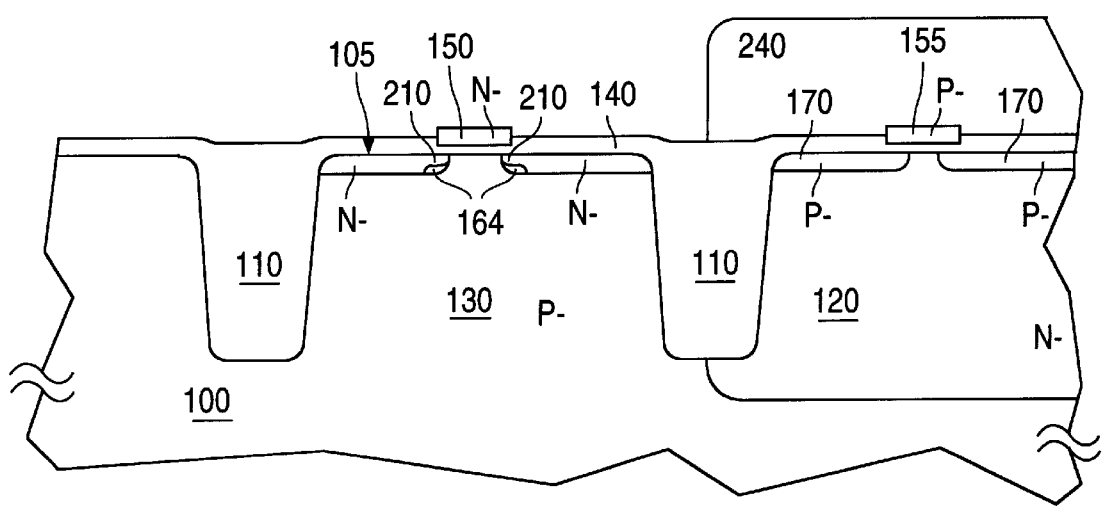

FIG. 13 shows an alternative embodiment of forming NLDD junctions in accordance with the present finvention. In FIG. 13 the phosphorous is implanted prior to the formation of sidewall spacers 180. In this embodiment the phosphorous is not combined with the arsenic implant during the N+ implant. In this embodiment, a NLDD mask 240 is conventionally patterned from a layer of photoresist to expose NMOS region 130. Phosphorous is then implanted into NMOS region 130 at a dosage of approximately $1\times10^{14}$ cm$^{-2}$ and implant energy of approximately 20 KeV. An implant angle of approximately 30° to 40° may be used. The NLDD mask 240 is removed and a thermal cycle drives the phosphorous into a NLDD junction 210 under gate 150 as shown in FIG. 13. The phosphorous overcompensates for the boron doping in the P− doped regions 160, thereby defining halo regions 164. The phosphorous also overcompensates for the boron doping in polysilicon gate 150. The remaining fabrication process is similar to the above embodiment, including the formation of sidewall spacers 180 as shown in FIG. 7 and the N+ implant (of arsenic without phosphorous) shown in FIG. 8.

Figure 11:
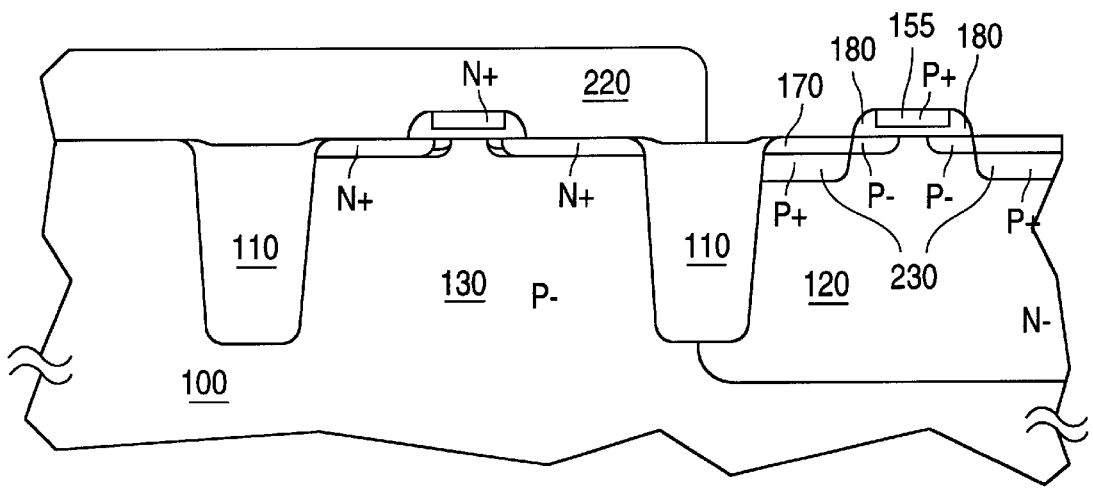
Figure 12:
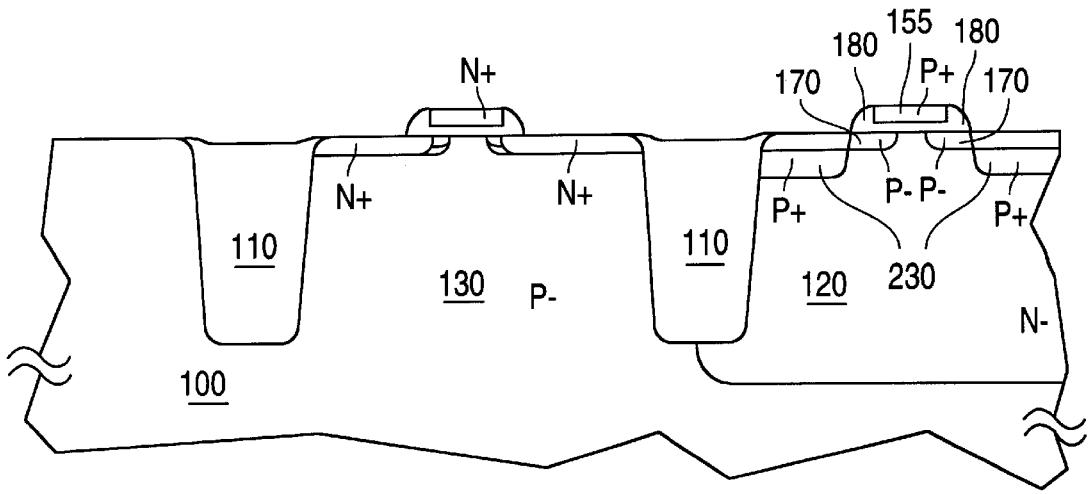

FIG. 11 shows a P+ type dopant implant within PMOS region 120. A layer of photoresist 220 is applied to the surface of substrate 100 and again patterned in a well-known manner to form a mask over the NMOS region 130. A conventional P+ type dopant of boron ($BF_2$) is implanted at an energy of 25 KeV and dosage of $5\times10^{15}$ cm$^{-2}$. The P+ implant creates S/D junctions 230 as well as P+ dopes polysilicon gate 155, as shown in FIG. 11. Photoresist 220 is then removed, as shown in FIG. 12, and a conventional rapid thermal processing activation of 1050° C. for 10 seconds is used to drive in the P+ type dopant.

With the desired source/drain junctions thus formed, including the lightly doped drain junctions, the remaining steps in the fabrication of the desired CMOS device may be conducted pursuant to conventional processing methods.

While the present invention has been described in connection with specific embodiments, variations of these embodiments will be obvious to those of ordinary skill in the art. For instance, it will be understood by those skilled in the art that the dopants may be implanted in a different order in accordance with the present invention. Therefore, the spirit and scope of the appended claims should not be limited to the foregoing description.

What is claimed is:

1. A method of forming source/drain junctions within a substrate, said method comprising:

forming active areas within said substrate, said active areas comprise NMOS regions and PMOS regions;

forming gate electrodes on the surface of said substrate, said gate electrodes formed over said active areas;

performing a blanket implant of a dopant of a first conductivity into said substrate, wherein said dopant of said first conductivity type is formed in the source/drain junctions of said active areas;

depositing a layer of dielectric material and etching said layer to form sidewall spacers adjacent each opposite sidewall of said gate electrodes;

forming a first mask on the surface of said substrate to expose only those active areas where it is desirable to introduce a dopant of a second conductivity type;

performing a first masked implant of said dopant of said second conductivity type into the exposed active areas of said substrate, wherein said dopant of said second conductivity type is aligned with said sidewall spacers, and wherein said dopant of said second conductivity type overcompensates for said dopant of said first conductivity type; and performing an annealing thermal cycle, wherein said annealing thermal cycle drives said dopant of said second conductivity type under said sidewall spacers to form a lightly doped drain region under said sidewall spacers wherein said dopant of said first conductivity type forms a lightly doped drain junction in said PMOS regions and a halo structure in said NMOS regions.

2. The method of claim 1 wherein said dopant of said first conductivity type comprises boron.

3. The method of claim 1, wherein said first mask is formed to expose said NMOS regions of said substrate, and wherein said dopant of said second conductivity type forms said source/drain junctions in said NMOS regions of said substrate.

4. The method of claim 3, wherein said dopant of said second conductivity type comprises arsenic.

5. The method of claim 4, wherein said dopant of said second conductivity type further comprises phosphorous.

6. The method of claim 5, wherein said dopant of said second conductivity type further forms lightly doped drain junctions in said NMOS regions of said substrate.

7. The method of claim 1, wherein said blanket implant of said dopant of said first conductivity is of a first concentration and said first masked implant of said dopant of said second conductivity type is of a second concentration, further comprising:

forming a second mask on the surface of said substrate to expose only those active areas where it is desirable to introduce a dopant of said first conductivity at a third concentration; and performing a second masked implant of said dopant of said first conductivity type at said third concentration into the exposed active areas of said substrate, wherein said dopant of said first conductivity type at said third concentration is aligned with said sidewall spacers, and wherein said dopant of said first conductivity type at said third concentration overcompensates for said dopant of said first conductivity type at said first concentration.

8. The method of claim 7, wherein said second mask is formed to expose said PMOS region of said substrate, and wherein said dopant of said first conductivity type at said third concentration forms said source/drain junctions in said PMOS regions of said substrate.

9. The method of claim 8, wherein said dopant of said first conductivity type comprises boron.

10. The method of claim 1, wherein said blanket implant of said dopant of said first conductivity is of a first concentration and said first masked implant of said dopant of said second conductivity type is of a second concentration, further comprising:

forming a third mask on the surface of said substrate prior to forming said sidewall spacers, said third mask formed to expose only those active areas where it is desirable to introduce a dopant of said second conductivity type at a fourth concentration; and performing a third masked implant of said dopant of said second conductivity type at said fourth concentration into the exposed active areas of said substrate, wherein said dopant of said second conductivity type at said fourth concentration is aligned with said gate electrodes, and wherein said dopant of said second conductivity type at said fourth concentration overcompensates for said dopant of said first conductivity type at said first concentration.

11. The method of claim 10, wherein said third mask is formed to expose said NMOS regions of said substrate, and wherein said dopant of said second conductivity type at said fourth concentration forms lightly doped drain junctions in said NMOS regions of said substrate.

12. The method of claim 11, wherein said dopant of said second conductivity type comprises phosphorous.

13. A method of forming source/drain junctions within a semiconductor substrate, said method comprising:

providing a substrate with an upper surface, said substrate having NMOS regions and PMOS regions;

forming gate electrodes on said surface of said substrate over said NMOS regions and over said PMOS regions;

performing a blanket implant of a first dopant into said substrate, wherein said blanket dopant forms lightly doped drain junctions in said PMOS region and halo regions in said NMOS regions;

depositing a layer of dielectric material and etching said layer to form sidewall spacers adjacent to the walls of said gate electrodes;

forming a first mask on the surface of said substrate to expose said NMOS regions of said substrate;

performing a masked implant of a second dopant into said NMOS regions of said substrate, wherein said second dopant is formed within said NMOS regions aligned with said sidewall spacers, said second dopant forms source/drain junctions within said NMOS regions; and performing an annealing thermal cycle for driving said second dopant under said sidewall spacers to form a lightly doped drain region under said sidewall spacers wherein said second dopant further forms lightly doped drain junctions in said NMOS regions, and wherein said remaining regions implanted with said first dopant define said halo regions.

14. The method of claim 13, wherein said second dopant comprises arsenic and phosphorous.

15. The method of claim 13, wherein said blanket implant of said first dopant is at a first concentration and said masked implant of said second dopant is at a second concentration, further comprising:

forming a second mask on the surface of said substrate to expose said PMOS regions of said substrate; and performing a masked implant of said first dopant at a third concentration into said PMOS regions of said substrate, wherein said first dopant at said third concentration is formed within said PMOS regions aligned with said gate electrodes over said PMOS regions, said first dopant at said third concentration forms source/drain junctions within said PMOS regions.

16. The method of claim 13, wherein said blanket implant of said first dopant is at a first concentration and said masked implant of said second dopant is at a second concentration, further comprising:

forming a third mask on the surface of said substrate prior to forming said sidewall spacers adjacent to the walls of said gate electrodes, said third mask being formed to expose said NMOS regions of said substrate; and performing a masked implant of said second dopant at a fourth concentration into said NMOS regions of said substrate, wherein said second dopant at said fourth concentration is formed within said NMOS regions aligned with said gate electrodes over said NMOS regions, said second dopant at said fourth concentration forms lightly doped drain junctions within said NMOS regions.

17. The method of claim 16, wherein said fourth dopant comprises phosphorous.

* * * * *

UNITED STATES PATENT AND TRADEMARK OFFICE
CERTIFICATE OF CORRECTION

PATENT NO.   : 6,184,099 B1
DATED        : February 6, 2001
INVENTOR(S)  : Albert M. Bergemont and Christopher I. Michael It is certified that error appears in the above-identified patent and that said Letters Patent is hereby corrected as shown below:

<u>Column 4,</u>
Line 5, please delete "finvention" and insert -- invention --.

Signed and Sealed this

Eleventh Day of February, 2003

JAMES E. ROGAN
*Director of the United States Patent and Trademark Office*